United States Patent [19]
Swanson et al.

[11] Patent Number: 4,746,899
[45] Date of Patent: May 24, 1988

[54] METHOD FOR REDUCING EFFECTS OF ELECTRICAL NOISE IN AN ANALOG-TO-DIGITAL CONVERTER

[75] Inventors: Eric J. Swanson, Buda; Navdeep S. Sooch; David J. Knapp, both of Austin, all of Tex.

[73] Assignee: Crystal Semiconductor Corporation, Austin, Tex.

[21] Appl. No.: 916,160

[22] Filed: Oct. 7, 1986

[51] Int. Cl.$^4$ .............................................. H03M 1/08
[52] U.S. Cl. .............................. 340/347 AD; 364/724
[58] Field of Search ............ 332/11 D; 340/347 AD, 340/347 CC, 347 SH, 347 NT; 364/574, 724, 784, 785, 825; 375/51, 103

[56] References Cited

U.S. PATENT DOCUMENTS 4,227,185 10/1980 Kronlage ..................... 340/347 NT 4,495,591 1/1985 Loomis, Jr. ........................ 364/724

Primary Examiner—William M. Shoop, Jr.
Assistant Examiner—Richard K. Blum
Attorney, Agent, or Firm—Leonard & Lott

[57] ABSTRACT

Method for reducing deleterious effects of electrical noise in an analog-to-digital converter wherein both the analog and digital circuitry of the A/D converter are embodied in the same integrated circuit. The method includes sampling an analog input voltage with a first clock signal, generating a second clock signal that is delayed with respect to the first clock signal, and using the second clock signal as a clock for the digital circuitry. In accordance with another aspect of the invention, the method for reducing effects of noise in an A/D converter wherein such noise is generated by a digital decimation filter includes synchronously pipelining the arithmetic operations of the digital decimation filter.

4 Claims, 4 Drawing Sheets

METHOD FOR REDUCING EFFECTS OF ELECTRICAL NOISE IN AN ANALOG-TO-DIGITAL CONVERTER

TECHNICAL FIELD

The present invention generally relates to electronic systems and, more particularly, to a method for managing electrical noise in an analog-to-digital converter.

BACKGROUND OF THE INVENTION

It is economically desirable for many applications that analog circuitry be combined in a monolithic integrated circuit with digital logic circuitry. One such application is the A/D converter of the oversampling type.

An A/D converter of the oversampling type is one in which the analog input voltage is sampled at a rate that is substantially higher than the desired output sampling rate of the converter. Converters of this type are well known in the art and typically have an analog front-end and a digital filter which processes the output of the analog front-end. A suitable analog front-end for this purpose is the delta-sigma modulator, which is also referred to in the literature as a sigma-delta modulator.

For the digital output of a high-resolution A/D converter to be accurate, it is necessary that electrical noise interference with the analog front-end be minimized. A 16-bit A/D converter ideally provides 65,536 different digital outputs, each of which accurately corresponds to a different analog input voltage. For an analog input voltage range of typically plus or minus three volts, or six volts total, the incremental difference in analog voltages is on the order of 100 microvolts.

It is well known that digital logic circuitry can generate considerable electrical noise as a result of logic gates being caused to transition from one logic state to the other. Such noise creates particular difficulties in combining a significant number of high-speed logic gates and a noise-sensitive analog front-end on the same monolithic integrated circuit chip.

In accordance with the foregoing, a need exists for a method for reducing deleterious effects of electrical noise on the analog-to-digital conversion process in the circumstance where it is desirable to include both analog and digital circuitry in the common semiconductor substrate of an integrated circuit.

SUMMARY OF THE INVENTION

The present invention provides a method for reducing deleterious effects on the analog-to-digital conversion process of electrical noise generated by digital logic circuitry.

In accordance with one aspect of the invention, a method for reducing the effects of electrical noise in an analog-to-digital converter includes sampling the analog input voltage with a first clock signal, generating a second clock signal having its leading edge delayed with respect to the trailing edge of the first clock signal, and utilizing the second clock signal as the slave clock for the digital circuitry embodied in a common semiconductor substrate.

In accordance with another aspect of the invention, the method for reducing deleterious effects of electrical noise generated by the switching action of a digital decimation filter includes reducing the number of gate delays subsequent to the leading edge of the digital circuitry slave clock by synchronously pipelining the arithmetic operations of the decimation filter.

The aforementioned and other features, characteristics, advantages, and the invention in general, will be better understood from the following detailed description of an illustrative embodiment when taken in conjunction with the accompanying drawings.

DETAILED DESCRIPTION OF A PREFERRED EMBODIMENT

Figure 1:
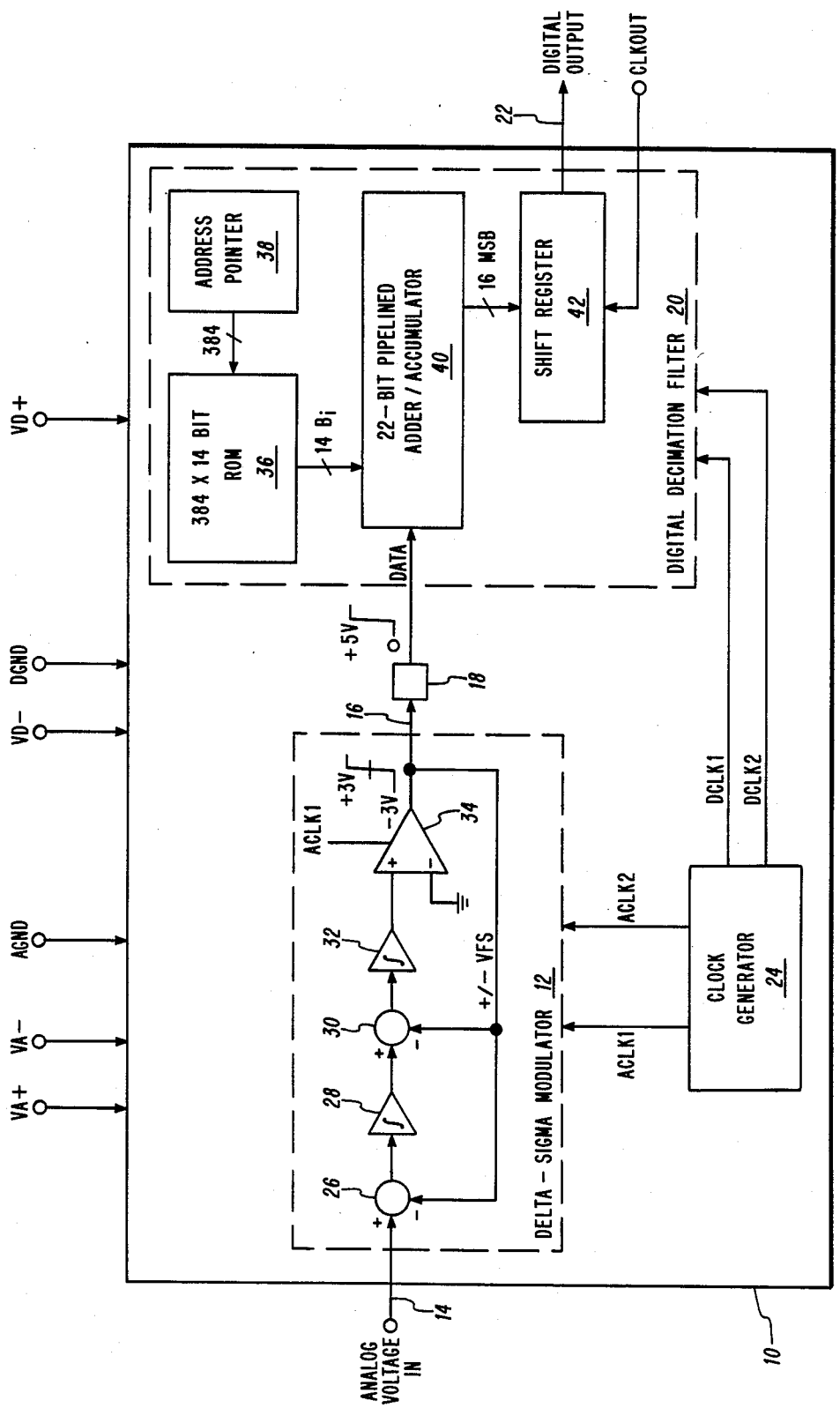
FIG. 1 is a block diagram of an A/D converter utilized in conjunction with the method of the present invention.

Referring now to FIG. 1, a 16-bit A/D converter 10 of a type which is utilized in conjunction with the method of the present invention is illustrated. All elements of the A/D converter 10 are embodied in a CMOS integrated circuit having a common semiconductor substrate. A typical CMOS integrated circuit suitable for the circuitry of FIG. 1 has an N-type substrate common to all P-channel transistors embodied therein.

The A/D converter 10 includes a two-stage delta-sigma modulator 12 which receives the analog voltage input at an input terminal 14. The delta-sigma modulator 12 provides an output on a node 16.

The A/D converter 10 also includes a voltage buffer 18 having an input coupled to the node 16 and having an output which provides a signal designated as DATA. The only function of the voltage buffer 18 is to convert typically plus and minus 3 volt signals on the node 16 to signal swings of 0 to +5 volts for the signal DATA.

Further included in the A/D converter 10 is a digital decimation filter 20 which receives the signal DATA and which serially provides a 16-bit digital output on an output terminal 22.

Additionally included in the A/D converter 10 is a clock generator 24 which provides analog clocks ACLK1 and ACLK2 to the delta-sigma modulator 12, and which provides digital clocks DCLK1 and DCLK2 to the digital decimation filter 20.

Power to the A/D converter 10 is provided by a positive analog supply voltage VA+, a negative analog supply voltage VA−, an analog ground reference AGND, a negative digital supply voltage VD−, a digital ground reference DGND, and a positive digital supply voltage VD+. VA+ and VA− each have a magnitude of typically 5 volts with respect to the analog ground reference AGND; VD+ and VD− each have a magnitude of typically 5 volts with respect to the digital ground reference DGND. For the purpose of reducing deleterious effects on analog performance of noise on the digital ground, the analog ground reference AGND and the digital ground reference DGND are not interconnected on the monolithic integrated circuit which embodies the A/D converter 10; but, instead, are electrically connected external to the monolithic integrated circuit.

The delta-sigma modulator 12 includes a first summer 26, a first integrator 28, a second summer 30, a second integrator 32, and a latching comparator 34. The latching comparator 34 is strobed by the clock ACKL1 and provides on the node 16 an output-and-feedback signal designated as +/−VFS.

The digital decimation filter 20 includes a 384×14 bit ROM 36 which is addressed by an address pointer 38. The ROM 36 provides 14 outputs designated as $B_i$. The 14 $B_i$ ROM outputs are input to the 14 least significant bits of a 22-bit pipelined adder/accumulator 40. Outputs from the 16 most significant bits of the adder/accumulator 40 are provided to a 16-bit parallel-in/ serial-out shift register 42. The shift register 42 provides the digital output signal on the node 22.

Figure 2:
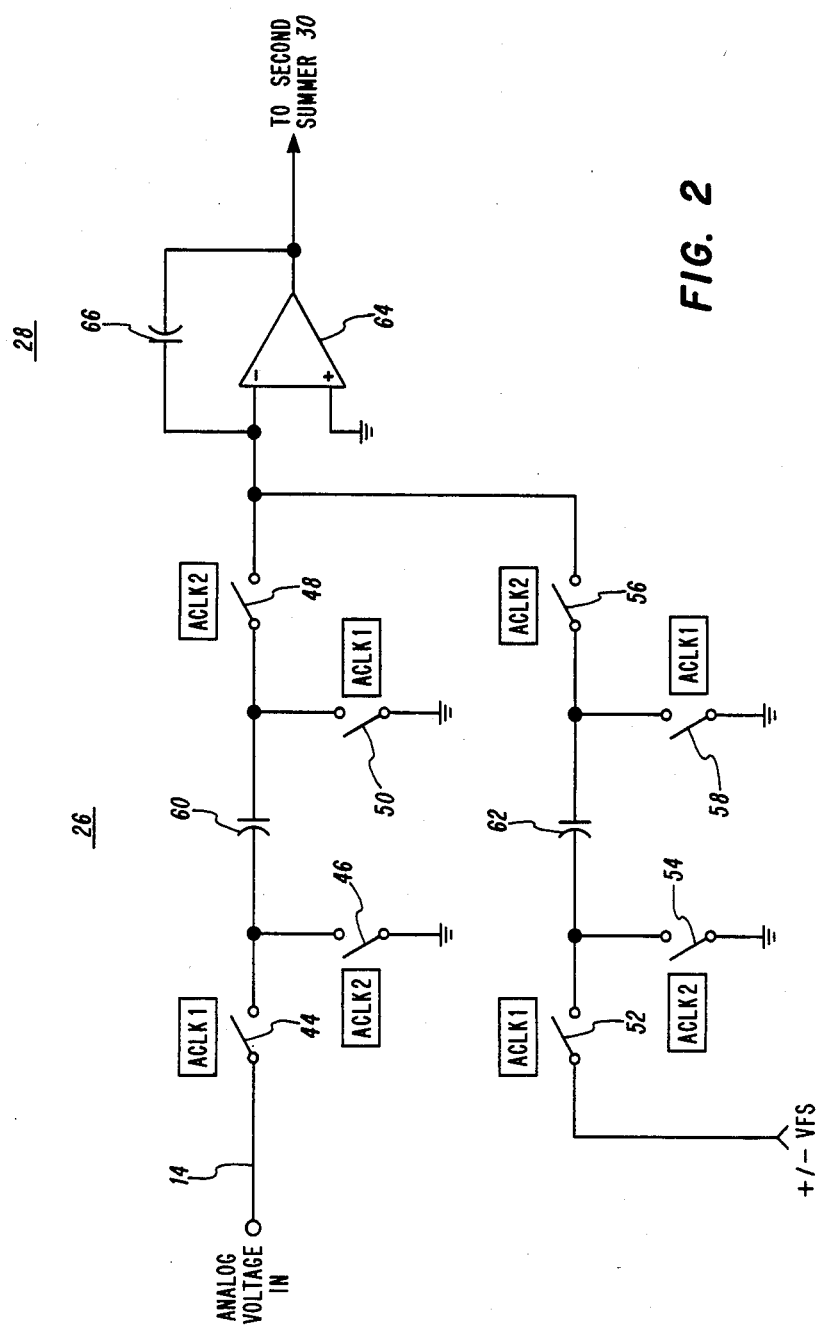
FIG. 2 is an electrical schematic diagram of a summer and integrator included in the delta-sigma modulator of the A/D converter of FIG. 1.

Referring now to FIG. 2, there is illustrated an electrical schematic diagram of the summer 26 and integrator 28 which comprise the input portion of the delta-sigma modulator 12 of FIG. 1. The first summer 26 includes switches 44, 46, 48, 50, 52, 54, 56, and 58. The switches 44, 50, 52, and 58 are caused to be conductive by the analog clock ACLK1 being high; the switches 46, 48, 54, and 56 are caused to be conductive by the analog clock ACLK2. The first summer 26 further includes capacitors 60 and 62, each of which has a capacitance of typically 5 pF.

The first integrator 28 includes an operational amplifier 64 and a feedback capacitor 66. In the illustrative embodiment, the capacitor 66 has a capacitance of typically 20 pF.

The analog clocks ACLK1 and ACLK2 are nonoverlapping clocks which run continuously at a frequency of approximately 2.048 MHz. When the analog clock ACLK1 is high, the capacitor 60 is caused to be charged to the analog voltage input and the capacitor 62 is caused to be charged to the voltage of the feedback signal +/−VFS which is typically at either +3 volts or at a −3 volts. After being charged, the terminals of the capacitors 60 and 62 are caused to become floating by the opening of all of the switches 44 through 58. Next, when the analog clock ACLK2 goes high, the switches 46, 48, 54, and 56 are caused to become conductive, thereby connecting the capacitors 60 and 62 between ground and the inverting input of the operational amplifier 64, resulting in charge being transferred to or from the feedback capacitor 66.

The second summer 30 and second integrator 32 are configured in the same manner as that of the first summer 26 and first integrator 28.

The theory and operation of delta-sigma modulators is well known to those of ordinary skill in the art, and, therefore, will not be discussed here in detail. For the present purposes, it should suffice to note that the output of the delta-sigma modulator 12 on the node 16 is a continuous high-speed digital bit pattern having one logic level represented by a level of approximately plus three volts and having the other logic level being represented by a voltage level of approximately negative three volts. The digital bit stream is clocked at the 2.048 MHz rate of the analog clock ACLK1. This rate is substantially higher than the frequencies of interest applied to the analog voltage input terminal 14. For the illustrative embodiment, the frequencies of interest at the analog voltage input are from DC to approximately 8 kHz. For a given number of samples of the analog voltage input—384 samples, for example—the relative number of logic ones to logic zeros which are output from the delta-sigma modulator 12 is indicative of the polarity and magnitude of the voltage being applied to the analog voltage input terminal 14.

It is a function of the digital decimation filter 20 to extract the low frequency analog voltage input information which is embedded in the high-speed serial bit stream being outputted from the delta-sigma modulator, and to provide a 16-bit digital representation of that sampled analog input. Another function of the digital decimation filter 20 is to provide a low-pass frequency response for the incoming analog signal.

Figure 3:
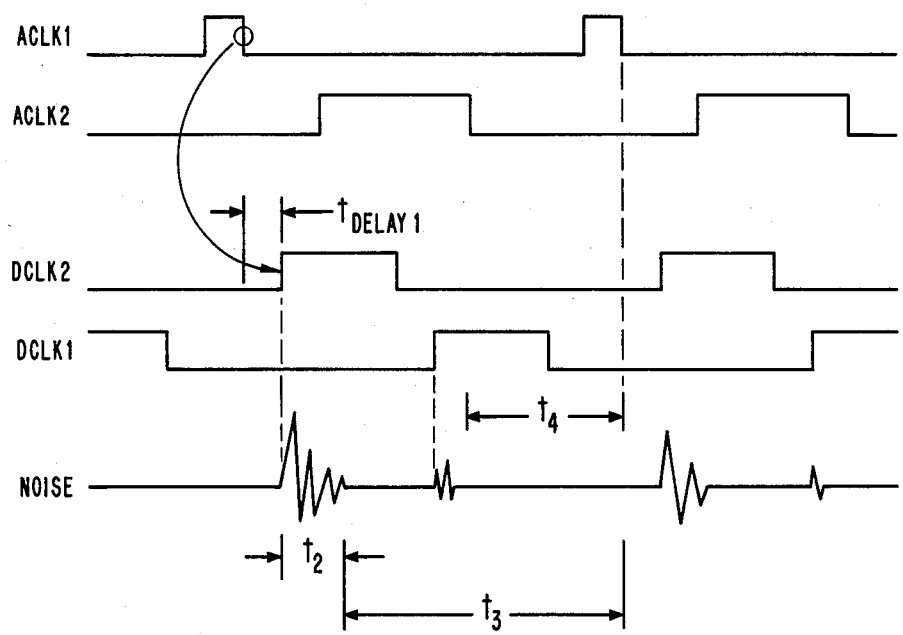
FIG. 3 is a timing diagram illustrating timing relationships in accordance with the method of the present invention.

FIG. 3 is a timing diagram illustrating timing relationships in accordance with the method of the present invention. The top two waveforms illustrate the nonoverlapping analog clocks ACLK1 and ACLK2. The analog clock ACLK1 needs only to be high for a time sufficient to fully charge the capacitors 60 and 62 and to operate the latching comparator 34; the analog clock ACLK1 can, however, be made identical to or even wider than the analog clock ACLK2 (provided, however, that the two analog clocks are not allowed to be high at the same time). For noise considerations, the only critical time of the analog clocks is the time immediately prior to the trailing edge of the clock ACLK1. Charge coupled onto the capacitors 60 and 62 due to noise voltages immediately prior to the trailing edge of the clock ACLK1 can cause an erroneous analog sample to be taken. After the terminals of the capacitors 60 and 62 are caused to become floating, noise voltages coupled to the capacitors 60 and 62 are of little consequence due to charge conservation principles.

The digital clocks DCLK2 and DCLK1 are also illustrated in FIG. 3. These clocks, too, are non-overlapping clocks which continuously run at a 2.048 MHz rate. In a manner that is conventional for digital logic systems, the clock DCLK1 is the master clock for master/slave digital storage elements (such as D-type flip-flops or latches), and the clock DCLK2 is the slave clock for the slave portion of such digital storage elements.

In a typical synchronous digital system, the leading edge of the slave clock initiates a sequence of logic level transitions among the logic gates which are interconnected between clocked storage elements. Each time a logic gate makes a transition from one logic level to the other, current transients are drawn between the supply voltage and ground. These current transients collectively generate data-dependent electrical noise in the digital system, particularly on the power supply and ground leads. Although much of the electrical noise generated by the changing of the logic states of the logic gates can be isolated from sensitive analog circuitry embodied in the same integrated circuit by utilizing separate supplies and grounds for the analog and digital circuitry, a certain amount of electrical noise may still couple to the analog circuitry through the common substrate or by way of capacitive coupling. To further compound the problem, electrical noise transients may have extended durations due to inductive lead ringing.

For reducing the deleterious effects of electrical noise generated by the on-chip digital circuitry, the leading edge of the digital slave clock DCLK2 is delayed with respect to the trailing edge of the sampling analog clock ACLK1. This delay is illustrated in FIG. 3 and designated therein as tDELAY1. In the preferred embodiment, inverter delays in the clock generator 24 are utilized to generate a delay tDELAY1 of typically 50 nS.

A signal labeled NOISE is also shown in FIG. 3 to illustrate the timing of electrical noise generated in the A/D converter 10. The waveforms of FIG. 3 are not necessarily drawn to scale with respect to each other.

Although the greatest amount of noise is generated commencing at the leading edge of the clock DCLK2, it should be noted that electrical noise may likewise be generated commencing at the leading edge of the master clock DCLK1. In order to minimize the effects of electrical noise on the analog portion of the A/D converter 10, it is advantageous that a long time be provided for the electrical noise to settle prior to the time immediately preceding the trailing edge of the analog clock ACLK1. Thus, it is advantageous that the time of high noise generation, designated as t2 in FIG. 3, be mimimized in order that the settling time t3 may be maximized. Similarly, it is advantageous to maximize the time designated as t4 in FIG. 3.

The time of high noise, t2, can be reduced by reducing the number of gate delays between master/slave elements of the digital circuitry. For the functions required of the digital decimation filter 20, however, there are significant trade-offs between the number of gate delays and integrated circuit chip area required to implement the logic circuitry.

The arithmetic operations of a digital decimation filter used in conjunction with a delta-sigma modulator can be implemented in various ways. A high resolution A/D converter such as the 16-bit A/D converter 10 of FIG. 1 requires arithmetic operation upon digital words having a substantial number of bits in each word. For example, in the digital decimation filter 20 illustrated in FIG. 1, it is necessary to either add or subtract 14-bit words which are outputted from the ROM 36 to or from a 22-bit word stored in an accumulator register in the adder/accumulator 40. The signal DATA controls whether an addition or a subtraction is performed: if the signal DATA is a logic 1, an addition is performed; alternatively, if the signal DATA is a logic 0, a subtraction is performed. Consequently, for the illustrative embodiment, because the signal DATA outputs bits to the digital decimation filter 20 at a 2.048 MHz rate, each addition or subtraction must be completed in approximately 500 nS. A chip-area efficient means of performing the addition or subtraction could be realized with a conventional serial ripple adder; but such an adder for 22-bit operation would typically result in 44 or more gate delays between clocked elements. With reference again to FIG. 3, it should be appreciated that the time t2 would likely be too long for an acceptable settling time t3.

The time t2 could be minimized by utilizing a completely parallel arithmetic architecture for the adder/accumulator at the expense of circuit complexity and possibly uneconomically-large chip area.

A suitable compromise between the number of gate delays so as to keep t2 reasonably small while conserving integrated circuit chip area is obtained by synchronously pipelining the arithmetic operations of the digital decimation filter. In this context, synchronously pipelining an arithmetic operation means to perform the arithmetic operation in a time-serial manner whereby a generated carry from a stage is not permitted to affect the arithmetic result of any stage other than that of the next most significant bit during the next clock cycle. The digital decimation filter 20 illustrated in FIG. 1 performs its required arithmetic operations in such a synchronously-pipelined manner as described below.

Figure 4:
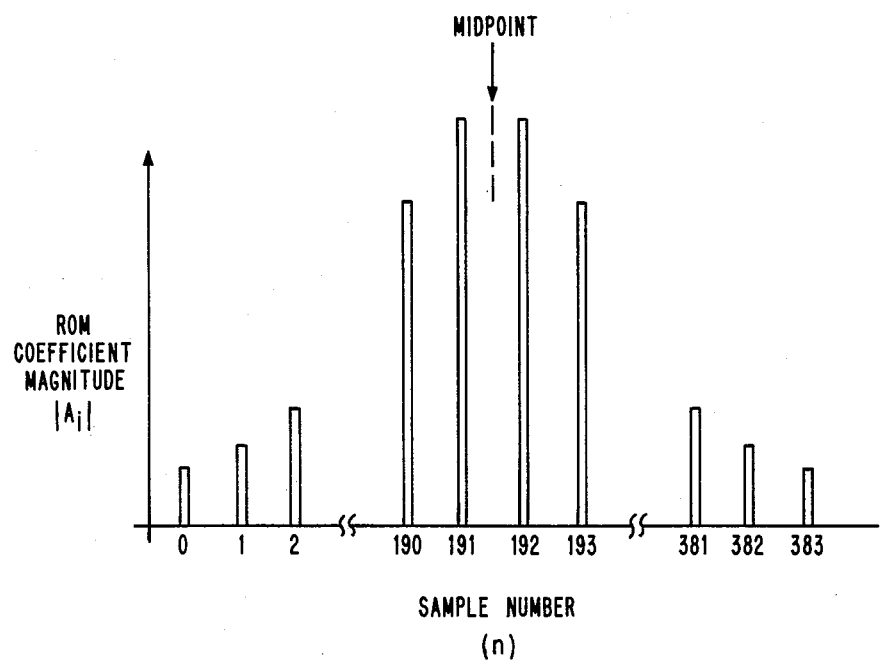
FIG. 4 is a bar graph illustrating the magnitudes of digital coefficients utilized in the convolution process of the digital decimation filter included in the A/D converter of FIG. 1.

Referring now to FIG. 4, there is shown a bar graph which illustrates the magnitudes of the digital ROM coefficients which are utilized in the convolution process of the digital decimation filter 20. This bar graph is indicative of what is termed a 384th Order decimation filter. The symmetry about the mid point of the graph indicates that the filter will have a linear phase versus frequency characteristic, which is highly desirable for many applications. Additionally, this type of filter is referred to as a finite impulse response filter. For an understanding of the pipelined structure, the manner by which a 384th Order conventional non-pipelined filter would operate is next described.

In a non-pipelined architecture, the convolution process would commence with the clearing of the accumulator, followed by multiplying the 384th 14-bit ROM coefficient, designated $A_{383}$, by the digital data being output from the analog oversampling modulator. The result of that multiplication is then stored in an accumulator. During the next clock cycle, the 14-bit ROM coefficient $A_{382}$ is then likewise multiplied by the new data output from the oversampling modulator, and the result is added to the accumulator. That process is repeated until all products are completed and added to the accumulator. The final result in the accumulator is a digital number which is indicative of the value of the analog voltage being applied to the input of the A/D converter.

For oversampling modulators such as that of the delta-sigma modulator 12 of FIG. 1 which provide only a 1-bit wide stream of digital data, the above-described multiplications are not necessary; instead, it is sufficient for each arithmetic operation to perform either an addition or a subtraction of the ROM coefficient to or from the accumulator in accordance with whether the signal DATA is a logic 1 or a logic 0. To further simplify matters, it is well known that subtraction can be performed on binary numbers by inverting each of the bits of the binary number to be subtracted, and then adding the complemented number plus one to the minuend (the accumulator in this case).

Figure 5:
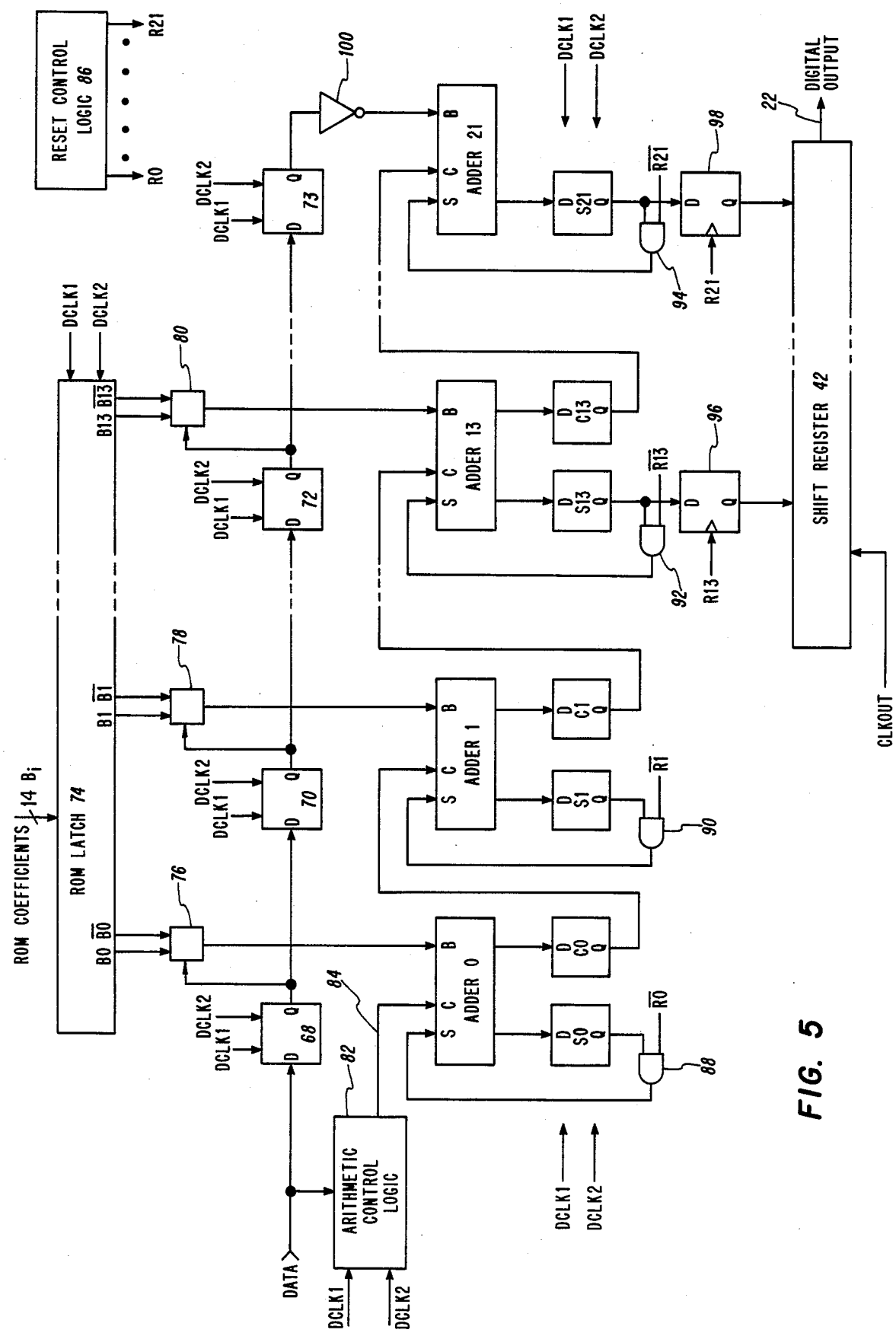
FIG. 5 is a logic and block diagram illustrating details of an embodiment of the digital decimation filter included in the A/D converter of FIG. 1.

Referring now to FIG. 5, a logic and block diagram illustrates details of an embodiment of the pipelined adder/accumulator 40 as included in the digital decimation filter 20.

The signal DATA is received by a 22-bit shift register, 4 bits of which are illustrated in FIG. 5 as D-type latches 68, 70, 72, and 73. Each of the latches 68, 70, 72 and 73 is of the master/slave type, with the master being clocked by clock DCLK1 and the slave being clocked by the clock DCLK2.

Fourteen ROM coefficient bits from the ROM 36 are clocked into a ROM latch 74 by the clock DCLK1 and are outputted, together with their complements, from the ROM latch 74 by the clock DCLK2. The trues and complements of the ROM bits are provided to 14 respective 1-of-2 multiplexors, 3 of which are shown in FIG. 5 as multiplexors 76, 78, and 80.

The signal DATA is also clocked by the clock DCLK1 into an arithmetic control logic 82 which has an output node 84. If the signal DATA is a logic 1, indicating that a ROM coefficient is to be added to an accumulated result, a logic 0 is provided on the node 84; alternatively, if the signal DATA is a logic 0, indicating that the ROM coefficient is to be subtracted (which will be performed by adding the complement plus one), a logic 1 will be provided on the node 84.

The adder/accumulator 40 additionally includes 22 combinational logic adder elements, four of which are illustrated in FIG. 5 as ADDER0, ADDER1, ADDER13, and ADDER21. Each of the adder elements comprises conventional combinational logic for adding two binary bits plus an input carry to provide a sum output and a carry output. Each of the adder elements ADDER0 through ADDER21 is coupled to a respective latch for storing the sum. Four of the 22 sum latches are shown in FIG. 5 and are designated as latches S0, S1, S13, and S21. Only 21 carry latches are required inasmuch as there is no carry required from the most significant bit in this application. Three of the 21 carry latches are illustrated in FIG. 5 and are designated as latches C0, C1, and C13. Each of the sum and carry latches is of the master/slave type, with the master being clocked by the clock DCLK1 and the slave being clocked by the clock DCLK2.

Reset control logic 86 has 22 outputs which provide reset signals R0 through R21. The complements of these signals are respectively coupled to 22 AND gates, four of which are shown in FIG. 5 and are designated as gates 88, 90, 92, and 94.

The pipelined arithmetic operation is next described. At the commencement of a convolution cycle, the output of the latch 68 will select, through the multiplexor 76, either the true or complement of the least significant bit of the ROM coefficient $A_{383}$ for an input to the adder element ADDER0. If an addition is to be performed, the true bit is selected, whereas if a subtraction is to be performed, the complement is selected. Also during this clock period, the reset signal R0 goes high, causing the gate 88 to inhibit any logic 1 sum feedback from the latch S0 into the adder element ADDER0, thereby giving the appearance to the adder element ADDER0 that the latch S0 has been reset. And, as previously discussed, the node 84 will provide a logic 1 input to the adder element ADDER0 if a subtraction is to be performed but otherwise will be at a logic 0. The least significant bit sum and carry of the first addition are then stored in the master sections of the latches S0 and C0.

During the next clock cycle, the DATA bit which defines whether an addition or subtraction of a particular ROM coefficient is to be performed is transferred from the latch 68 to the output of the latch 70. During this next clock cycle, the next-to-least significant bit of the ROM coefficient $A_{383}$ is outputted from the ROM latch 74 at the B1 output. Through the multiplexor 78, either the true or the complement of this ROM coefficient bit is coupled as an input to the adder element ADDER1. The adder element ADDER1 adds that input to any carry that may have resulted from the previous cycle. And during this next cycle, the reset signal R1 is high, causing the output of the gate 90 to be a logic 0, and thereby giving the appearance to the adder element ADDER1 as though the latch S1 has been reset. The resulting sum and carry from the adder element ADDER1 are stored in the latches S1 and C1, respectively.

Also during this next clock cycle, the next bit of the signal DATA has been transferred to the output of the latch 68 and, in the same manner as in the previous clock cycle, controls the multiplexor 76 for selecting either the true or complement of a ROM coefficient bit at the least significant bit output of the ROM latch 74. During this cycle, however, the B0 output provides the logic state of the least significant bit of the next smaller numbered ROM coefficient, which in this case is that of the ROM coefficient $A_{382}$. And during this clock cycle, the reset signal R0 is a logic 0, allowing the sum accumulated from the previous clock cycle and stored in the latch S0 to be added to the ROM bit and to the logic state on the node 84.

During the initial 22 clock cycles of a convolution, the reset control logic 86 sequences a single logic 1, starting with the reset signal R0 and continuing through the reset signal R21. The reset signals R0 through R21 then remain at logic 0's until the convolution process has been completed. Accordingly, the latches S0 through S21 are effectively cleared at the beginning of a convolution and are allowed to accumulate a result as the convolution process proceeds.

Because there are only 14 ROM bits, each of the outputs of the last 8 bits of the 22-bit shift register which receives the signal DATA is respectively coupled through an inverter into its associated ADDER element in order to simulate the output of a logic 0 ROM bit and thereby provide a logic 1 input to the ADDER element if a subtraction operation is called for. The last of these inverters is shown in FIG. 5 and designated as inverter 100.

After a total of 384 clock cycles of the above-described operation have been completed, the latch S0 will contain the appropriate result of the additions or subtractions of the least significant bits of all 384 ROM coefficients stored in the ROM 36. An additional clock cycle is required for the sum of the next-to-least significant bit to be completed and stored in the latch S1. Thus, at the end of the 384th clock cycle, and only during that clock cycle, the logic state stored in the latch S0 represents the correct result of the accumulated least significant bits; at the end of the 385th clock cycle, and only during that clock cycle, the logic state stored in the latch S1 represents the correct result of the accumulated next-to-least significant bits; and so forth.

The values of the ROM coefficients are specifically chosen so that if only additions are performed during the convolution process (corresponding to a maximum analog input voltage being applied to the input of the A/D converter) the maximum accumulated result will be all 1's. Although 22 bits are accumulated, the 6 least significant bits of the final result are discarded and only the higher 16 bits are saved as the output of the convolution process. For the illustrative embodiment, the timing of signals needed for strobing the sum latch registers in order to capture the accumulated result corresponds to the timing of the reset control logic 86. Accordingly, reset signals R6 through R21 are used as clocks to 16 D-type latches, respectively, each of which D-type latches receives at the proper time one bit of the accumulated result. Two of these 16 D-type latches are shown in FIG. 5 and designated as latches 96 and 98. The digital information stored in the latches 96 and 98, together with that of their companion 14 latches, is subsequently transferred to the parallel-in/serial-out shift register 42. A clock signal CLKOUT may then be utilized to serially shift out the 16-bit digital output on the output terminal 22.

It should be understood that the pipelined arithmetic operation described above requires no more than seven gate delays between master/slave clocked elements, and, therefore, is particularly suitable for minimizing the time t2 of FIG. 3.

Referring again to FIG. 1, it should be understood that the address pointer 38 sequentially addresses one 14-bit ROM word each clock cycle, commencing with $A_{383}$ and continuing to $A_0$, after which the addressing cycle is continuously repeated. Due to the pipelined nature of the adder/accumulator 40, the ROM bits that comprise a single coefficient are not simultaneously needed at the 14 outputs of the ROM 36; but, instead, are staggered in the ROM so as to be presented at the appropriate time to the adder/accumulator 40.

A preferred embodiment of the present invention has been described. It should be apparent to persons of ordinary skill in the art that changes may be made in the method and circuitry described without departing from the spirit and scope of the invention. For example, for improved aliasing characteristics of the A/D converter 10, modifications can be made to the digital decimation filter 20. The digital decimation filter 20 could, for example, be triplicated (but with each of the ROM address pointers of the 3 filters skewed by 128 addresses with respect to each other) in order that a new digital output would be available once every 128 clock cycles rather than once every 384 clock cycles. Such a modification, however, would not alter the teachings of the present invention. Similarly, the invention is applicable to synchronously pipelining multiplication operations as well as those of addition and subtraction.

What is claimed is:

1. In conjunction with an integrated circuit having an analog-to-digital converter included therein, said analog-to-digital converter having both analog and digital circuitry embodied in a common semiconductor substrate, said digital circuitry being responsive to the leading edge of a slave clock signal for changing the logic states of a plurality of logic gates and thereby generating electrical noise, a method for reducing deleterious effects of said electrical noise on the analog-to-digital conversion process, said method comprising:

a. providing a first clock signal to said analog circuitry for controlling the sampling of an analog input voltage;
  b. sampling said analog input voltage during a sampling portion of the period of said first clock signal and terminating said sampling at the trailing edge of said sampling portion of said first clock signal;
  c. generating a second clock signal having its leading edge delayed with respect to the trailing edge of said first clock signal; and
  d. providing said second clock signal to said digital circuitry as the slave clock thereof.

2. In conjunction with an integrated circuit having an analog-to-digital converter included therein, said analog-to-digital converter being of the type having an analog front-end of the oversampling type coupled to a digital decimation filter, a method for reducing deleterious effects of electrical noise coupled into the analog circuitry of said analog-to-digital converter, said electrical noise being generated by the switching action of the circuitry comprising said decimation filter, said method comprising:

a. providing a slave clock signal to said decimation filter for synchronously clocking the logic circuitry comprising said decimation filter;
  b. reducing the number of gate delays subsequent to the leading edge of said slave clock signal by synchronously pipelining the arithmetic operations of said decimation filter;
  c. providing a sampling clock signal to said analog front-end; and
  d. sampling the analog input voltage during a sampling portion of the period of said sampling clock signal and terminating the sampling of the analog input voltage shortly prior to the leading edge of said slave clock signal.

3. The method of claim 1 wherein said analog circuitry comprises an analog front-end of the oversampling type.

4. The method of claim 3 wherein said analog front-end of the oversampling type comprises a delta-sigma modulator.

* * * * *